United States Patent [19]

Bonnell et al.

[11] Patent Number: 4,998,342
[45] Date of Patent: Mar. 12, 1991

[54] METHOD OF ATTACHING ELECTRONIC COMPONENTS

[75] Inventors: Ralph E. Bonnell, Austin; George C. Castello, Round Rock; Karl G. Hoebener, Georgetown, all of Tex.

[73] Assignee: International Business Machines Corporation, Armonk, N.Y.

[21] Appl. No.: 401,359

[22] Filed: Aug. 31, 1989

[51] Int. Cl.$^5$ .............................................. H05K 3/34
[52] U.S. Cl. ................................. 29/840; 228/180.1; 228/180.2; 174/260; 361/400; 361/403
[58] Field of Search ............ 29/840; 228/180.1, 180.2; 361/400, 403; 174/260

[56] References Cited

U.S. PATENT DOCUMENTS

| | | | |
|---|---|---|---|
| 4,139,881 | 2/1979 | Shimizu et al. | 228/180.1 X |
| 4,345,371 | 8/1982 | Ohsawa et al. | 29/840 X |
| 4,506,443 | 3/1985 | Itoh | 29/840 |
| 4,515,304 | 5/1985 | Berger | 228/180.1 X |
| 4,664,308 | 5/1987 | Boynton | 228/180.1 |
| 4,761,881 | 8/1988 | Bora et al. | |

FOREIGN PATENT DOCUMENTS

| | | |
|---|---|---|
| 3445625 | 6/1986 | Fed. Rep. of Germany. |
| 59-207689 | 11/1984 | Japan .................................. 29/840 |
| 61-56491 | 3/1986 | Japan. |

OTHER PUBLICATIONS

P. Bakos et al., "Enhanced Double-Sided Surface Mounted Assembly", Research Disclosure, 12/87, 284, Kenneth Mason Pub. Limited, England.
Double-Sided Surface Mount Process, Hewlett-Packard Journal, Jun., 1989, pp. 23-24.

Primary Examiner—Carl E. Hall
Assistant Examiner—Carl J. Arbes
Attorney, Agent, or Firm—Andrea P. Bryant

[57] ABSTRACT

An improved method for double sided attachment of components to a printed circuit board is described wherein surface mount components soldered to a first surface of the circuit board (backside) are, once the board is inverted during reflow, retained in place only by force of molten solder surface tension.

10 Claims, 2 Drawing Sheets

METHOD OF ATTACHING ELECTRONIC COMPONENTS

BACKGROUND OF THE INVENTION

1. Field of the Invention

The present invention relates to attaching surface mountable components to both sides of a printed circuit card. More specifically, it relates to an improved method for cost effectively performing double sided assembly including two reflow operations without the need for using adhesive.

2. Description of the Prior Art

Commonly assigned U.S. Pat. No. 4,761,881 discloses a method for attaching surface mountable components to both sides of a printed circuit board and leaded components to a one side. Solder is screened onto surface mount lands and adhesive applied to the component receiving sites thereon and the components are placed. Adhesive ensures that the components remain in contact with the solder when the board is inverted. Solder is then screened into plated through-holes and onto surface mount lands on the second side of the board. Pin-in-hole and surface mount components are placed on the second side. Solder on both sides of the board is subjected to a single reflow operation.

U.S. Pat. No. 4,515,304 to Berger discloses a method for populating both sides of a printed circuit board and includes inserting the leads of leaded components through plated through-holes, cutting and clinching ends thereof prior to applying solder paste.

Research Disclosure, December, 1987, Issue No. 284, page 749 discloses a technique for enhanced double sided surface mount assembly which includes using a resist film as an adhesive.

JP 61056491 describes soldering both surfaces of a circuit substrate by mounting parts on the substrate surfaces followed by simultaneous dip and thermal emission reflow.

DE 3445625 describes soldering all components on both sides of a printed circuit board in one operation utilizing two different soldering methods. Components on one side of the board are held in position by adhesive. On the other side, a meltable solder is used to temporarily hold components. The assembly is then placed into a wave or dip solder machine.

Prior methods for double sided assembly usually require the use of adhesives. Several disadvantages are inherent in the use of adhesive. Adhesive restricts self centering and inhibits settling of components during reflow. Additional solder volume is required for filling gaps between leads and their associated pads.

Adhesive also causes difficulty during rework of printed circuit assemblies. Often tweezer type removal is part of a needed repair process. Adequate space within the card or board layout for accommodating twisting of the component to break the adhesive bond must be provided. Additionally, a problem may arise if adhesive remains on the circuit board and is not removed prior to component replacement. This adhesive residue must be removed before a successful reattach operation may occur.

When a single solder reflow process is used, the need for "no defect" operations is increased since extensive handling and cleaning may damage wet solder paste on the other side of the board.

SUMMARY OF THE INVENTION

The present invention overcomes the above noted problems of the prior art by eliminating the need for adhesives during double sided printed circuit board (PCB) assembly operations. The inventive process is a particular improvement over that taught in U.S. Pat. No. 4,761,881. The present invention proceeds from the discovery that surface mountable components having a lower resultant removal force than that necessary to break the surface tension of molten solder require no adhesive to retain component leads in contact with solder on a circuit board when that board is inverted and subjected to a reflow operation.

Removal force due to combined acceleration of gravity and vibration is based on a weight to lead ratio. Weight to lead ratio is defined as the weight of the component divided by the number of leads on the component.

In the process of the present invention, a first side of a PCB which has only surface mount lands has solder applied thereto. Surface mountable components are placed thereon and the solder is reflowed. The board is inverted. Solder is subsequently applied to surface mount lands and through plated through-holes located on and in the other side of the PCB. Pin-in-hole and surface mount components are placed and the board undergoes a second reflow operation during which the amount of removal force to which the first placed, now inverted, components are subjected is maintained so as to be less than the force required to overcome molten solder surface tension bonds. Further, the process may be used with infrared convection or vapor phase reflow processes.

Several advantages obtain from the use of the process of the present invention. The overall assembly process is simplified and process yield is increased. Volume of solder used for double sided assembly in accordance with our invention is less than that used in practicing prior art processes having adhesive induced standoff on backside assembly. Delay between populating the first and second sides of a given printed circuit board is permissible. Further, full card stripping for second side assembly defects is not required.

Alternatively, or in another aspect of the present invention, selective application of adhesive may occur after a first pass reflow, if it is desired to include components having a resultant removal force in excess of that force required to break the surface tension bond of molten solder.

BRIEF DESCRIPTION OF THE DRAWINGS

The above and additional features and advantages of the present invention will be appreciated from the description which follows, taken in connection with the accompanying drawing wherein the same reference numerals are used throughout to denote the same elements and wherein.

DESCRIPTION OF A PREFERRED EMBODIMENT

The process of the present invention has particular utility in populating a PCB when it is desired to have on one side only surface mount components, and on the other, both surface mount and pin-through-hole components. Throughout this description, that side of the circuit board to which only surface mount components is hereinafter referred to as the backside; while that surface of the printed circuit board to which both surface mount and pin-through-hole components will be attached will be hereinafter referred to as the front side.

Figure 1:
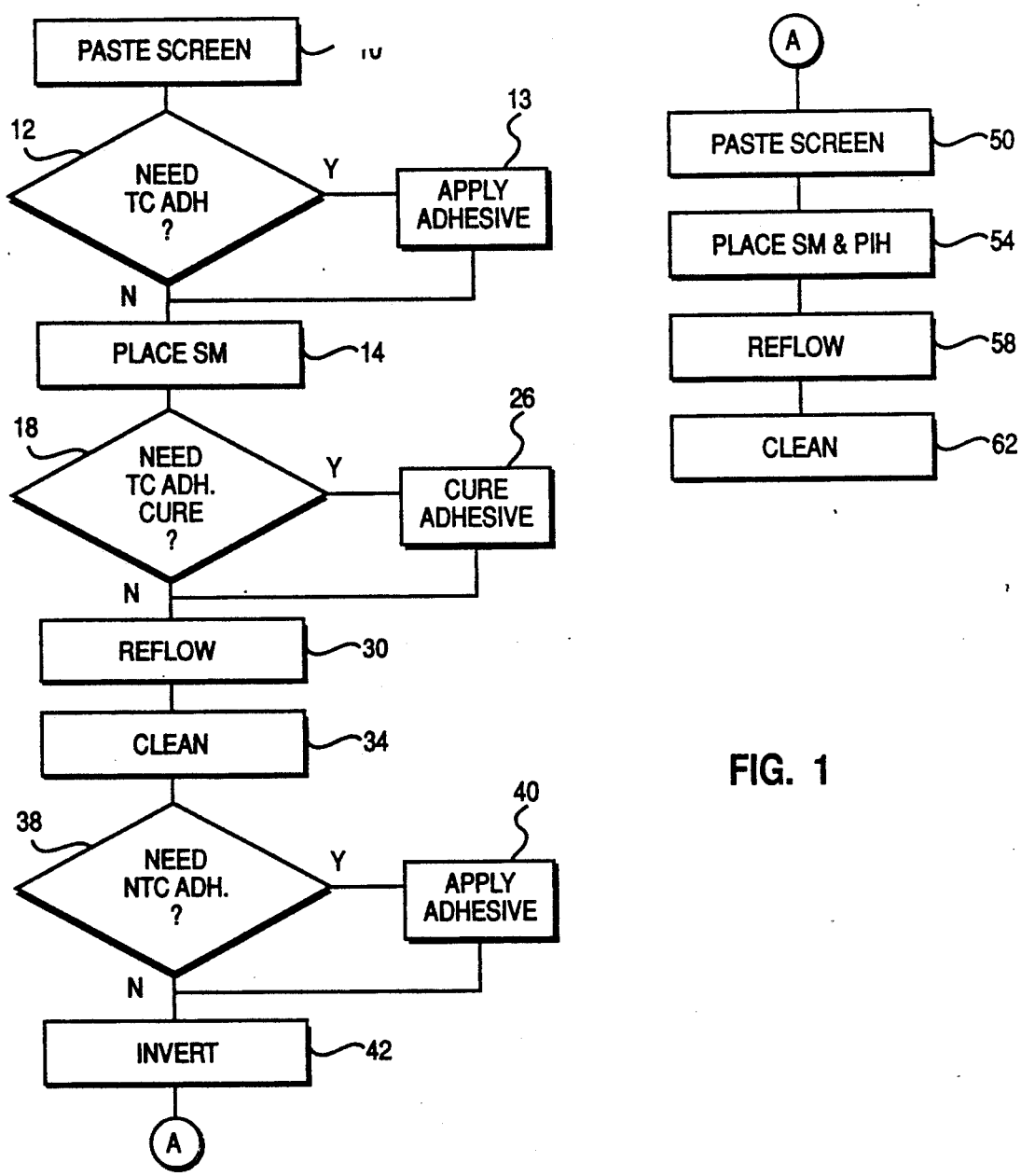
FIG. 1 is a flow chart of the process of the present invention.

Referring now to FIG. 1, at step 10 solder paste is screened onto the surface mount pads on the backside of a PCB. In this exemplary embodiment, solder loaded flux at least 90% metal by weight is preferred. By way of example, a 63% Sn/37%Pb solder is suitable.

Commercially available apparatus such as the AMI Inc. Model CP-2405 is appropriate for performing the solder apply step 10. The requirement is that a volume of solder paste be deposited appropriate to the type of component to be attached to the circuit board. Typically this is accomplished using a squeegee-like device to push solder through a metal stencil having a suitable thickness in the range of from about 2 to about 15 mils. Applied solder volume must be sufficient to form a joint meeting applicable inspection standards for the types of board and component being used.

Step 12 represents a decision whether to perform a step which is optional in our process. As will become more clear from the following description, there are some "heavy" components which may be desired for backside placement on a PCB. When the PCB is inverted the resultant gravitational force exerted on those "heavy" components exceeds that necessary to break the bond due to the surface tension of the molten solder during a second reflow operation. If such components are desired and a thermal cure adhesive is to be used, that adhesive is applied as appropriate in step 13.

However, in the preferred embodiment of this invention wherein no such "heavy" components are to be attached, the placement operation indicated at step 14 immediately follows the paste screen operation of step 10.

Placement accuracy is determined by the apparatus used, the component being placed and the pad size. Suitable commercially available apparatus for performing this step is a Dynapert MPS 2500 machine. Those having skill in the art understand that components must be placed so that all of their leads are in contact with the previously deposited predetermined amount of solder. The force required to effect this placement may vary from one gram to ten pounds.

Step 18 represents a decision based on type of adhesive used in step 13 and kind of reflow apparatus used in step 30. If step 13 adhesive requires curing and the reflow oven includes a capability to cure prior to reflow, no separate cure is needed. Otherwise, adhesive is cured at step 26.

As earlier mentioned, a variety of reflow methods are suitable for use in the present invention. Convection and vapor phase reflow are two of these methods. In this preferred embodiment we use an infrared reflow process.

Temperature settings for any reflow apparatus are, to a great extent, a function of the characteristics of PCB, components and particular solder composition chosen. In this illustrative embodiment, it has been found that a Vitronics 722 reflow oven including adhesive cure means is suitable for use with 63%Sn/37%Pb solder for populating a FR-4 PCB.

For conventional components, lead temperature should not be too far out of the 200-245 degree C temperature range with a minimum time at reflow of about 45 seconds. Those having skill in the art will appreciate that different dwell times at various phases of the reflow operation must be determined as a function of PCB, component and solder characteristics. In this embodiment with the solder noted we have found it acceptable to have a thermal ramp rate between 0.43 and 1.8 degrees C / second. Minimum time at temperatures in excess of 183 degrees C is about 45 seconds and the maximum time at temperatures over 183 degrees C should not exceed 145 seconds. Components should be able to withstand temperatures between about 200 degrees C and about 245 degrees C.

Cleaning, as needed as determined by the nature of solder and flux chosen for use, occurs at step 34. In our preferred embodiment, we have found it advantageous to use a Detrix PCBD-2DF-RR cleaner.

Similar to the decision represented at step 12, a decision is made at step 38 whether to use a non thermal cure adhesive. If so, it is applied at step 42. Again, in our preferred mode of practicing our invention, the board is inverted, step 42, after reflow as described in connection with step 30.

It should be noted however, that an interruption may occur at this point in our process. Surface mount components have been firmly attached to the PCB backside, and there is no requirement for immediately commencing population of the front side of the board.

Population of the front side of the board begins at step 50 with the application of a predetermined amount of solder into the plated-through-holes and onto the surface mount lands on the PCB front side. The same or similar apparatus as used in populating the PCB backside is appropriate for use in populating the front side. However, it is necessary to provide adequate, level support for the PCB during each of the following front side population steps.

At step 54, surface mount and pin-in-hole components are placed in the wet solder paste on the PCB front side. At step 58, the PCB undergoes the second pass reflow operation. It is during this reflow operation that the resultant removal force to which the surface mount components attached to the back side of the printed circuit board becomes critical.

The nature of this constraint will be described in more detail having reference to FIGS. 2 and 3. During reflow, vibration of the total apparatus must be maintained at such a level which when combined with resultant removal force does not increase resultant removal force above the force needed to break the solder bond caused by surface tension of the molten solder.

Mechanical factors affecting vibration include apparatus used for conveying a PCB through the reflow oven. Any worn spots in the conveyor belt or irregularities in the drive and follower sprockets or the like must be avoided. Similarly, isolation dampers at motor mounts are recommended.

After reflow, cleaning again occurs as needed and appropriate to the materials involved at step 62.

Figure 2:
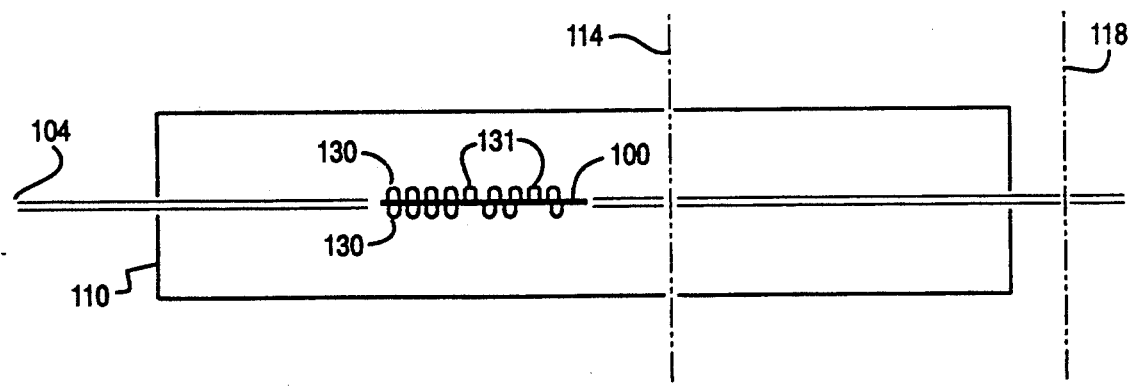
FIG. 2 schematically illustrates the progress of a circuit board through solder reflow apparatus.
Figure 3:
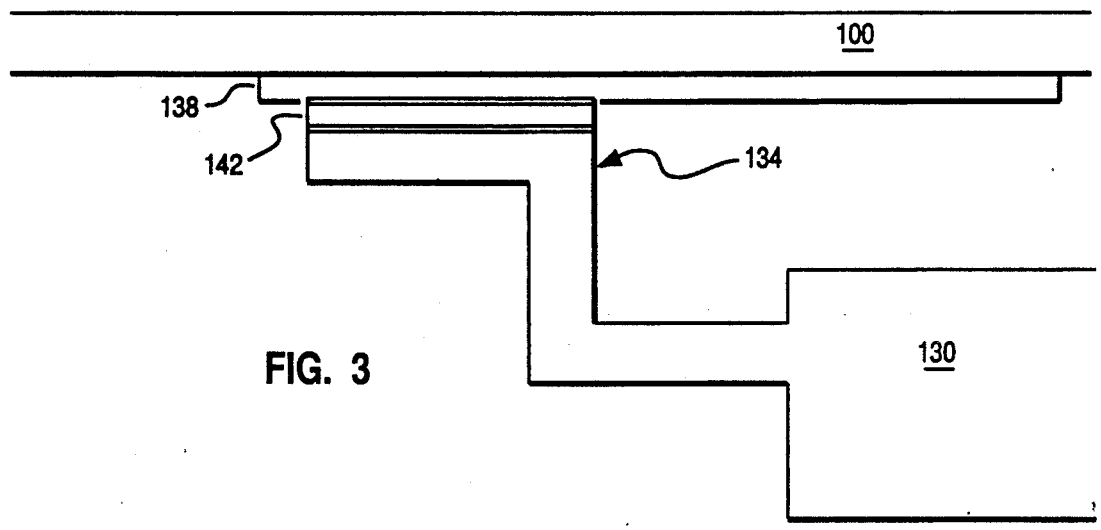
FIG. 3 schematically illustrates the connection of a component lead to a solder pad on a printed circuit board.

Refer now FIG. 2. A circuit board 100 populated in accordance with the process of FIG. 1 is shown on conveyor 104 which passes through an infrared reflow oven 110. The reflow area of oven 110 is that area between dotted lines 114 and 118. It is this area in which vibration maintenance at a minimum is critical during second pass reflow step 58 of the process.

Vibration is defined as the change in velocity of a component 130 in the direction of its Z axis with respect to the surface of printed circuit board 100. Those are the components on the back side of the printed circuit board which will be suspended upside down in the reflow area of oven 110 and held in contact with PCB 100 by means only of the surface tension of molten solder.

This phenomenon will be explained in greater detail having reference to FIG. 3 which is an enlarged schematic illustration of component 130 attached to circuit board 100 by means of multiple connections effected between individual leads 134 and their associated solder lands 138 on circuit board 100 by means of solder joint(s) 142.

A simplified expression of the force balance during second pass reflow is as follows:

$$S_t 33\ P_{min} - M_c \times (g + av) = X$$

where:
$S_t$ = surface tension 142
$P_{min}$ = minimum perimeter of any horizontal cross section of the solder joint 134
$M_c$ = mass of component 130 per lead
$g$ = acceleration due to gravity
$av$ = acceleration in z dimension due to vibration
$X$ = resultant force If X is greater than or equal to zero, component 130 is retained on board 100, since the holding force of surface tension is at least equal to the downward removal forces exerted on component 130. If X is less than zero, the combined forces of gravity and vibration, resultant removal force, exceed surface tension of solder 142 allowing component 130 to fall.

This simplified statement of the forces active neglects time constraints caused by solder viscosity and resonance within solder joint 142 and board 100. Resonance frequencies (and their harmonics) and viscosity effects as related to time are factors influencing the balance forces even when this balance briefly drops below zero. Solder joint 142 integrity remains intact. We, therefore, described the relationship to vibration to velocity change rather than that of vibration to actual acceleration.

Since the soldered area of component lead 134 is approximately equal to the minimum cross sectional area of solder joint 142, TABLE I may be used to determine the perimeter of solder joints for different components which may be attached with our process.

TABLE I

| COMPONENT | LEAD LENGTH | LEAD WIDTH | JOINT PERIMETER |
|---|---|---|---|
| 20 mil fine pitch | 0.13 cm | 0.025 cm | 0.31 cm |
| 25 mil fine pitch | 0.13 cm | 0.03 cm | 0.32 cm |
| 50 mil pitch SOJ | 0.18 cm | 0.041 cm | 0.44 cm |
| 50 mil pitch SO | 0.135 cm | 0.043 cm | 0.36 cm |

Components such as those in TABLE I are the major backside components which might fall off during second pass reflow. Our process will also work with chip capacitors and resistors, small outline transistors (SOTs) crystals and other such components as may need attachment.

An exemplary 63% Sn/37% Pb solder composition for use in our process has a surface tension of 490 dynes/cm. Acceleration of gravity is 980 cm/sec2. The above equation for resultant removal force may be used with any component of known weight to determine force magnitude required to overcome molden solder surface tension retaining components during second pass reflow.

For example, the weight/lead ratio of an 84 pin plastic leaded chip carrier (PLCC) with small "J" shaped leads is 0.08 grams/lead with a joint perimeter of 0.44 cm. Rearranging the above set out equation for resultant removal force to find maximum permissible vibration (MaxVib) force yields the following:

Set $x = 0$ then $$0 = S_t \times P_{min} - M_c(g + MaxVib)$$

Solving for MaxVib:

$$MaxVib = \frac{S_t \times P_{min} - M_c \times g}{M_c}$$

Substituting for $S_t$, $P_{min}$, $M_c$ and g gives $$MaxVib = \frac{(490\ dynes/cm \times 0.44\ cm - 980\ cm/sec^2 \times 0.08\ gr)}{0.08\ gr} =$$

$$1715\ cm/sec^2$$

1715 cm/sec 2 = 1.75 times the force of gravity. Therefore, excluding time restraints, a vibration pulse greater than 1.75 g dislodges a component. In practice, we have found that a pulse peaking above MaxVib elongates the solder joint, i.e., the perimeter of the solder joint decreases. If the duration of such a vibration pulse is such as to exceed permissible MaxVib for the decreasing perimeter, the joint breaks, allowing the component to fall. For shorter pulse duration, the joint reforms to its original stable configuration.

Component types having weight to lead ratios less than 0.1 grams/lead and a MaxVib expressed as a change in velocity may be used for backside attach in our process.

Figure 4:
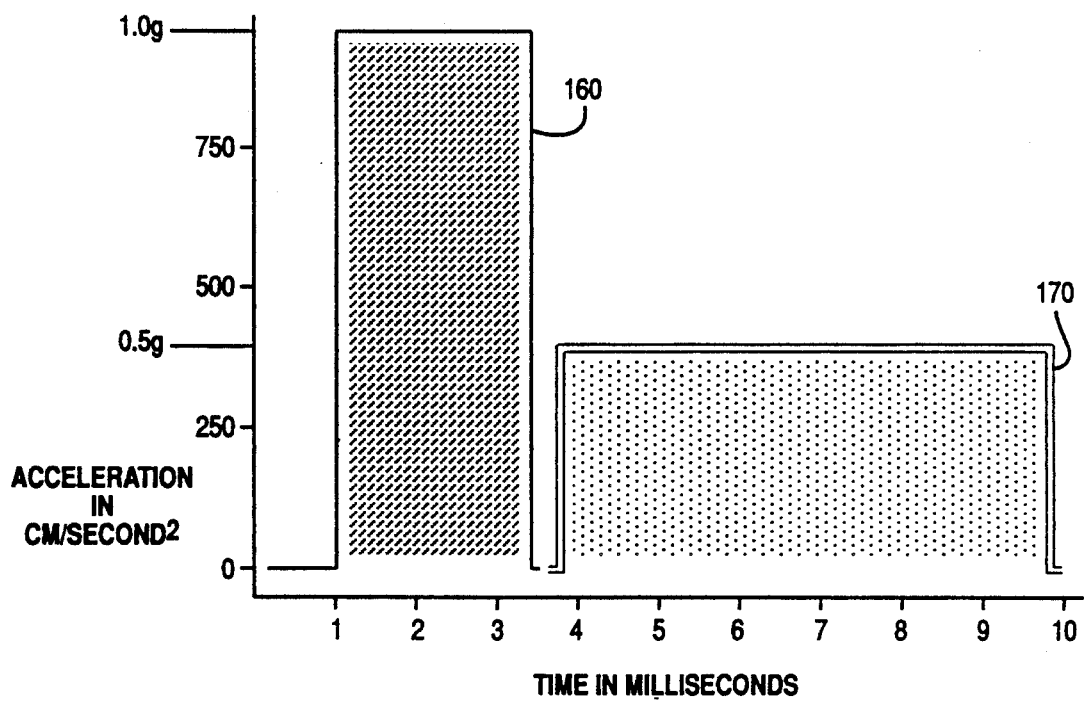
FIG. 4 graphically represents the relationship between total resultant removal force to which the lead shown in FIG. 3 is subjected and its resultant velocity changes through the reflow apparatus.

Refer to FIG. 4. Velocity change is measured as the area under a curve generated by plotting Z direction acceleration versus time duration of an acceleration pulse for the process of our invention. In this example, accelerometer data associated with an 84 pin PLCC component having a weight to lead ratio of 0.08 grams per lead is plotted versus time as a step function. Those skilled in the art will recognize this data to be solely exemplary in nature. The area under an acceleration peak, as shown in either of shaded areas 160 or 170, may not exceed 2.54 cm/sec displacement measured on the Z axis of component 130 in FIG. 2. We have found that this vibration limit is accurate for components having a weight to lead ratio less than or equal to 0.1 grams per lead with a reasonable safety margin.

While the invention has been described having reference to a particular preferred embodiment and modifications thereto, those having skill in the art will understand that the above described and other changes in form and detail may be made without departing from the spirit and scope of the invention as claimed.

We claim:

1. A process for populating both sides of a printed circuit board comprising the sequential steps of:
   (a) screening solder onto surface mount lands on a first side of the printed circuit board;
   (b) placing surface mount components on said lands on said first side;
   (c) reflowing solder applied in step (a);
   (d) screening solder on surface mount lands and into plated through-holes on a second side of said printed circuit board;
   (e) placing surface mount and pin in hole components on said second side; and
   (f) reflowing all solder on said printed circuit board.

2. The process of claim 1 including the additional step between steps (a) and (b) of:
   applying adhesive at sites on said first side of said printed circuit board for components having weight to lead ratio in excess of 0.1 grams per lead.

3. The process of claim 1 wherein step (b) includes choosing components having a weight to lead ratio less than or equal 0.1 grams per lead and said step (f) reflowing includes maintaining vibration level to which said printed circuit board is subjected less than or equal 2.54 cm per second.

4. The process of claims 1, 2 or 3 wherein step (f) includes passing the printed circuit board through an infrared reflow oven.

5. The process of claims 1, 2 or 3 wherein step (a) screening includes screening solder paste comprising at least 90% metal by weight, said metal being 63% tin, 37% lead.

6. An improved method of back side attach of surface mount components to a printed circuit substrate comprising these sequential steps of:
   (a) screening solder paste consisting of at least 90% metal by weight onto back side surface mount lands on the printed circuit board;
   (b) placing surface mount components on surface mount lands soldered in step (a);
   (c) reflowing solder paste;
   (d) inverting the printed circuit board;
   (e) populating the front side of said printed circuit board; and
   (f) reflowing all solder on said printed circuit board by passing said printed circuit board through an infrared convection oven while maintaining at a level less than or equal 2.54 cm per second Z axis displacement of said surface mount components.

7. The method of claim 6 wherein step (b) includes: choosing surface mount components having a weight to lead ratio less than or equal 0.1 gram per lead.

8. The process of claim 1 wherein step (1) includes: choosing a solder composition having in its molten state surface tension in the range of from about 450 to about 550 dynes/cm.

9. The method of claim 6 wherein step (a) includes: selecting a solder, said metal comprising a 63% tin, 37% lead alloy.

10. The method of claim 6 wherein step (a) includes: choosing a solder composition having in its molten state surface tension in the range of from about 450 to about 500 dynes/cm.

* * * * *